US006565370B1

(12) United States Patent
Kabat et al.

(10) Patent No.: US 6,565,370 B1
(45) Date of Patent: May 20, 2003

(54) CONNECTOR PROTECTION BRACKET

(75) Inventors: Zbigniew Kabat, Schaumburg, IL (US); Richard A. Walton, Carol Stream, IL (US)

(73) Assignee: AG Communication Systems Corporation, Phoenix, AZ (US)

( * ) Notice: Subject to any disclaimer, the term of this patent is extended or adjusted under 35 U.S.C. 154(b) by 0 days.

(21) Appl. No.: 10/093,922

(22) Filed: Mar. 11, 2002

(51) Int. Cl.[7] ............................................. H01R 13/44
(52) U.S. Cl. ....................... 439/135; 439/367; 439/922
(58) Field of Search ................................ 439/135, 136, 439/922, 367

(56) References Cited

U.S. PATENT DOCUMENTS

| 4,067,526 A | * | 1/1978 | Storer .......................... 248/65 |
| 5,472,355 A | * | 12/1995 | Wittmann .................... 439/373 |
| 5,928,023 A | * | 7/1999 | Buckner et al. ............ 439/373 |

* cited by examiner

Primary Examiner—P. Austin Bradley
Assistant Examiner—Truc Nguyen
(74) Attorney, Agent, or Firm—David J. Zwick

(57) ABSTRACT

A connector protection bracket that mounts to the rear of an electronic assembly, having a flange extending away from the electronic assembly to protect the connector such that should the rear of the assembly drop upon removal from a shelf, the flange, rather than the connector, will strike the shelf.

6 Claims, 3 Drawing Sheets

CONNECTOR PROTECTION BRACKET

FIELD OF THE INVENTION

The present invention relates to electronic assemblies, and more particularly to a rear connector protection bracket.

BACKGROUND OF THE INVENTION

Many electronic assemblies, such as commercially available power supplies, are commonly designed with a connector at the rear face. As the assembly is inserted into, for example, a shelf, the rear connector mates with a corresponding connecter on the shelf backplane.

In the situation where the electronic assembly is heavy, it is possible for damage to occur to the rear connector when the assembly is removed from the shelf. As the assembly clears the shelf upon:removal, the weight of the assembly may cause the rear of the assembly to drop. This may cause the rear connector to strike the shelf, thus causing damage to the connector.

SUMMARY OF THE INVENTION

Accordingly, it is an object of the present invention to provide an item of manufacture that will protect an electronic assembly rear mounted connector from damage upon removal of the assembly from a shelf or other electronic enclosure, while not interfering with the function of the connector.

The present invention is a connector protection bracket that mounts to the rear of the electronic assembly, preferably by a lower;connector mounting screw. The connector protection bracket has a flange extending away from the electronic assembly to protect the connector such that should the rear of the assembly drop upon removal from a shelf, the flange, rather than the connector, will strike the shelf.

DESCRIPTION OF THE PREFERRED EMBODIMENT

Figure 1:
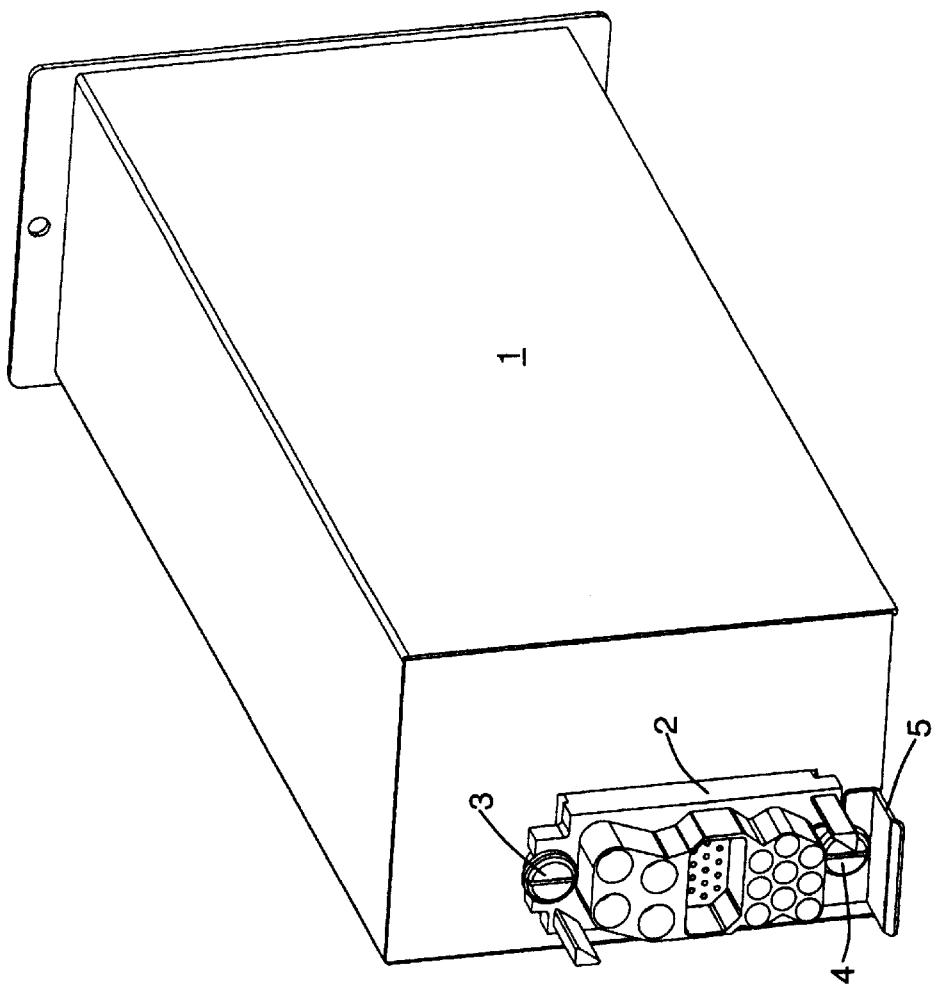
FIG. 1 shows a perspective view of a preferred embodiment of the connector protection bracket of the present invention.
Figure 2:
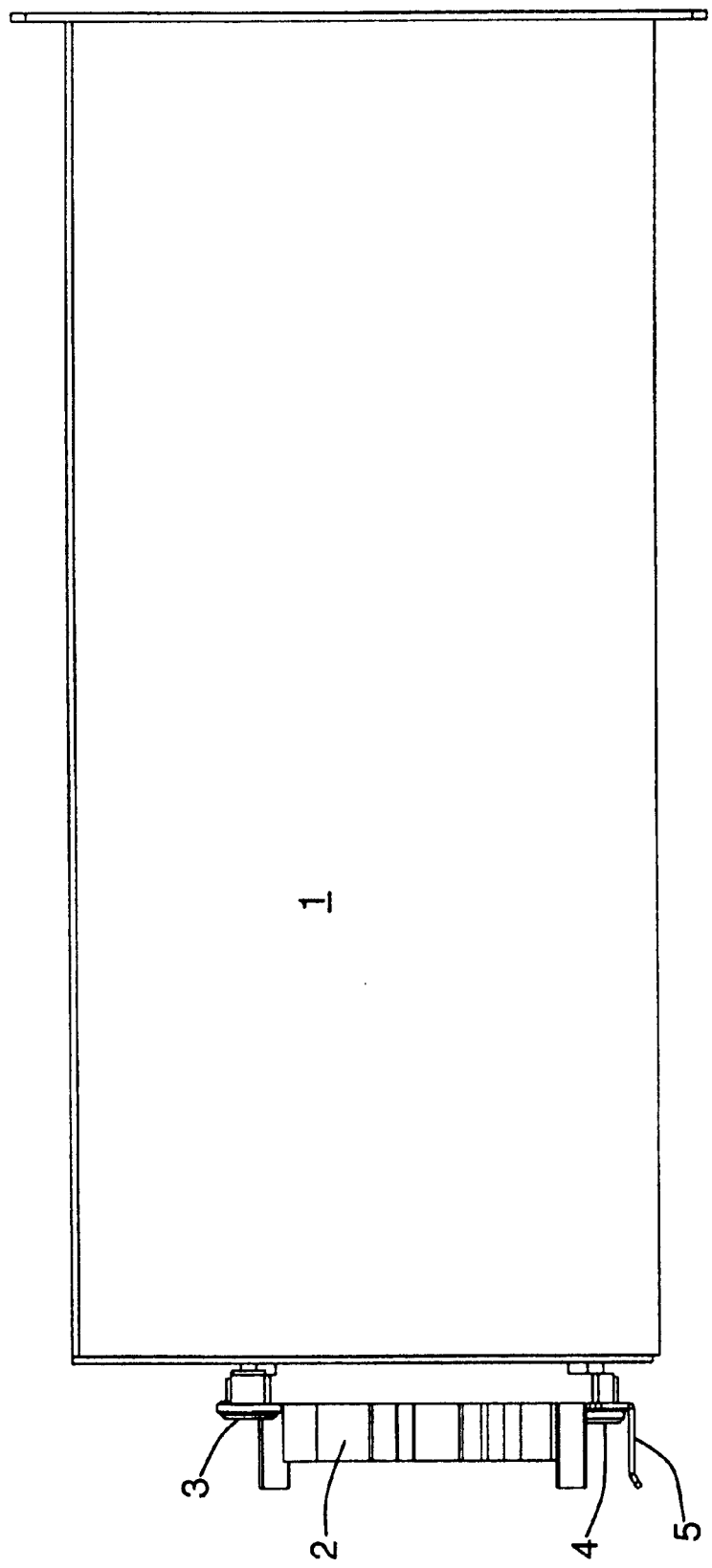
FIG. 2 shows a side view of a preferred embodiment of the connector protection bracket of the present invention.

FIGS. 1 and 2 show a perspective view and a side view, respectively, of a preferred embodiment of the connector protection bracket of the present invention. Electronic assembly 1 has a rear connector 2 mounted to electronic assembly 1 by upper and lower mounting screws 3 and 4, respectively. Connector protection bracket 5 is mounted to the rear of electronic assembly 1 by lower mounting screw 4. Connector protection bracket 5 extends outward from the rear of electronic, assembly 1 approximately to the same extent as rear connector 2.

In operation, when electronic assembly 1 is removed from a shelf or other electronic enclosure, there may be a tendency for the rear of the assembly to drop as it clears the shelf. Should this happen, connector protection bracket 5 will strike the shelf, thus protecting connector 2 from damage.

Figure 3:
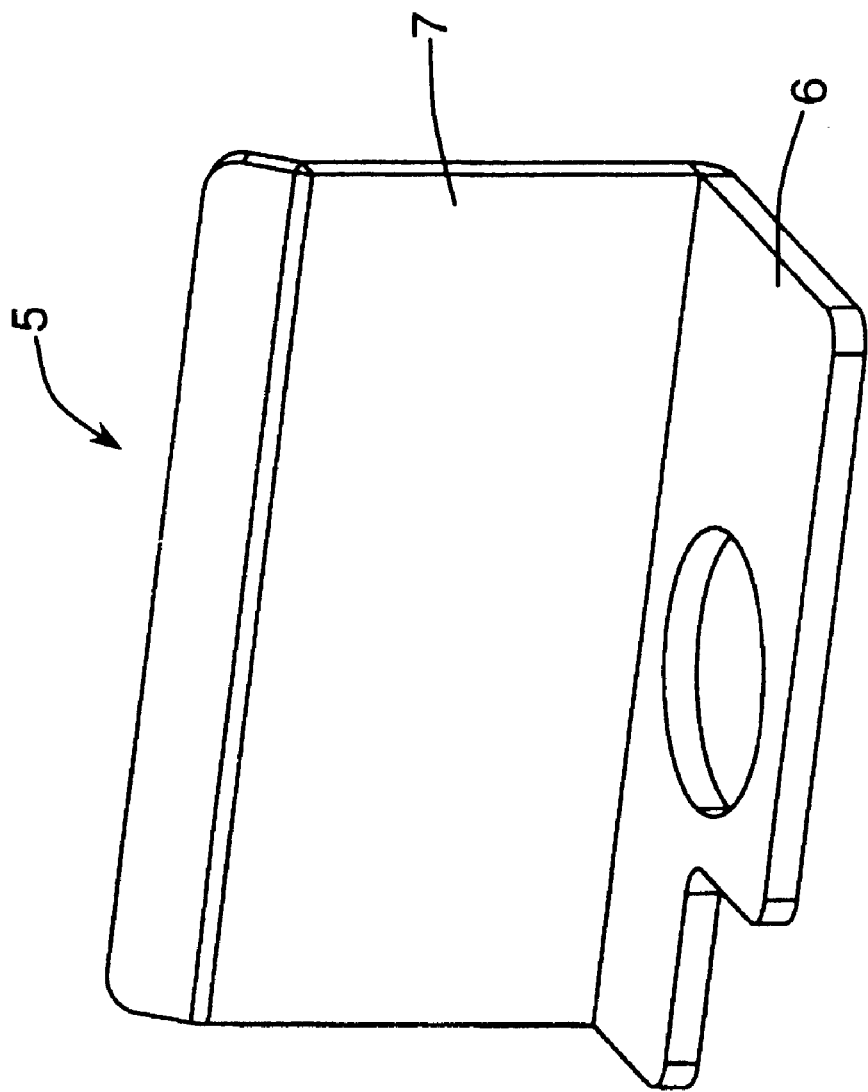
FIG. 3 shows a detail view of a preferred embodiment of the connector protection bracket of the present invention.

FIG. 3 shows a detail view of the preferred embodiment of connector protection bracket 5 shown in FIGS. 1 and 2.

Connector protection bracket 5 comprises two main pieces: back piece 6, and flange 7. In the preferred embodiment, connector protection bracket 5 is stamped from stainless steel sheet metal sufficiently thick to withstand striking the shelf with no or minimal permanent deformation. Connector protection bracket 5 may also be manufactured from a resilient material, such as a spring steel, so that upon striking the shelf, the shock transmitted to electronic assembly 1 is reduced.

In the preferred embodiment, back piece 6 is connected to connector 2 via lower mounting screw 4 through a hole in back piece 6. Generally, any suitable means for connection may be used to connect back piece 6 to connector 2 or the rear face of electronic assembly 1 such that the connection integrity is maintained upon connector protection bracket 5 striking the shelf upon removal of electronic assembly 1 from the shelf. Connection means include, but are not limited to, lower mounting screw 4 as shown, other connector mounting screw arrangements, mounting screws connecting back piece 6 directly to the rear face of electronic assembly 1, and tab-and-slot or tab-and-pocket arrangements between connector protection bracket 5 and electronic assembly 1.

In the preferred embodiment, back piece 6 is notched on one corner to accommodate a specific arrangement of connector 2. In general, the geometry of back piece 6 need only be sufficient to allow connection means substantial enough to withstand connector protection bracket 5 striking the shelf upon removal of electronic assembly 1 from the shelf, and maintain the integrity of the connection.

Flange 7 extends from back piece 6 from a proximal edge at roughly a right angle, although the exact angle can vary considerably, and is influenced or determined by geometries of the connector, mounting screw and backplane.

In one embodiment, the distal edge portion of flange 7 is angled slightly downward so as to "catch" the rear of electronic assembly 1 on the shelf should the rear of electronic assembly 1 drop during removal from the shelf. The angling downward of the distal edge portion of flange 7 maybe accomplished by bending a portion of the distal edge downward relative to the rest of the face of flange 7, as displayed in the FIGURES. It may also be accomplished by angling flange 7 downward. It may also be accomplished by applying a curve to flange 7, or a combination of bends.

While the present invention has been shown and described with respect to a preferred embodiment, it will be understood by those skilled in the art that modifications may be made thereto without departing from the scope and spirit of the invention. It is intended that the scope of the invention be defined by the claims appended hereto and their equivalents.

What is claimed is:

1. A connector protection bracket for use on an electronic assembly to protect from damage a rear connector on the assembly should the assembly drop as the assembly clears a shelf upon removal of the assembly from the shelf, said connector protection bracket comprising:

a back portion;

means for connection to connect said back portion proximal to said rear connector; and a flange connected to said back portion along a proximal edge and extending outward from said assembly to approximately the same extent as said rear connector, the distal edge of said flange, opposite said proximal edge, being angled slightly downward.

2. A connector protection bracket according to claim 1, wherein said connector protection bracket is manufactured from stainless steel sheet metal.

3. A connector protection bracket according to claim 1, wherein said connector protection bracket is manufactured from a spring steel.

4. A connector protection bracket according to claim 1, wherein said flange comprises a flat flange face extending straight outward from said proximal edge and a distal edge portion extending inward for a certain distance from said distal edge, said distal edge portion of said flange being angled slightly downward relative to said flange face.

5. A connector protection bracket according to claim 1, wherein said flange is flat and is angled slightly downward from said proximal edge.

6. A connector protection bracket according to claim 1, wherein said flange is arcuate and said distal edge is angled slightly downward.

* * * * *